(12) United States Patent
Chuang et al.

(10) Patent No.: US 9,373,275 B2
(45) Date of Patent: Jun. 21, 2016

(54) LEVEL SHIFTER OF DRIVING CIRCUIT AND OPERATING METHOD THEREOF

(71) Applicant: Raydium Semiconductor Corporation, Hsinchu (TW)

(72) Inventors: Kai-Lan Chuang, Tainan (TW); Chen-Yu Wang, Tainan (TW); Chien-Ru Chen, Ligang Township (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 8 days.

(21) Appl. No.: 14/504,141

(22) Filed: Oct. 1, 2014

(65) Prior Publication Data

US 2015/0097612 A1   Apr. 9, 2015

(30) Foreign Application Priority Data

Oct. 4, 2013  (TW) ............................. 102136077 A
Feb. 27, 2014 (TW) ............................. 103106729 A (51) Int. Cl.
*H03L 5/00*    (2006.01)
*G09G 3/20*    (2006.01)
*H03K 3/356*   (2006.01)

(52) U.S. Cl.
CPC ............ *G09G 3/20* (2013.01); *H03K 3/356182* (2013.01); *G09G 2310/0289* (2013.01)

(58) Field of Classification Search
CPC ............................. H03K 19/0185; G09G 3/20
USPC .................. 327/306, 333; 326/61–62, 80–81
See application file for complete search history.

(56) References Cited

U.S. PATENT DOCUMENTS

| | | | | |
|---|---|---|---|---|
| 6,242,962 B1 * | 6/2001 | Nakamura | ....... | H03K 3/356113 326/62 |
| 7,847,590 B2 * | 12/2010 | Pamperin | ......... | H03K 3/356113 326/68 |
| 8,575,986 B2 * | 11/2013 | Sumitomo | ....... | H03K 3/356165 326/81 |

* cited by examiner

*Primary Examiner* — Dinh T Le (57) ABSTRACT

A level shifter applied in a driving circuit of a display is disclosed. The level shifter includes a first stage of level shifting unit and a second stage of level shifting unit and used to convert an input voltage signal with low voltage level into an output voltage signal with high voltage level. In one example, the total number of the transistors needed by the level shifter is much fewer than that of the prior art, and additional voltage sources are not needed to provide middle voltages. The manufacturing cost of the exemplary level shifter can be reduced and the signal level shifting efficiency of multi-power domain can be enhanced.

10 Claims, 6 Drawing Sheets

LEVEL SHIFTER OF DRIVING CIRCUIT AND OPERATING METHOD THEREOF

BACKGROUND OF THE INVENTION

1. Field of the Invention

The invention relates to a driving circuit of a display; in particular, to a level shifter of the driving circuit applied in the display and operating method thereof.

2. Description of the Related Art

In a conventional driving circuit of a display, when a conventional level shifter converts a signal with low voltage level into the signal with high voltage level in multi-power domain, the conventional level shifter uses many stages of level shifting unit to perform signal voltage level conversions in order, so that the conversion voltage range in every signal voltage level conversion will not exceed the withstand voltages of the MOSFETs in the level shifter to avoid the leakage loss of the driving circuit and extend the life of the display.

Figure 1:
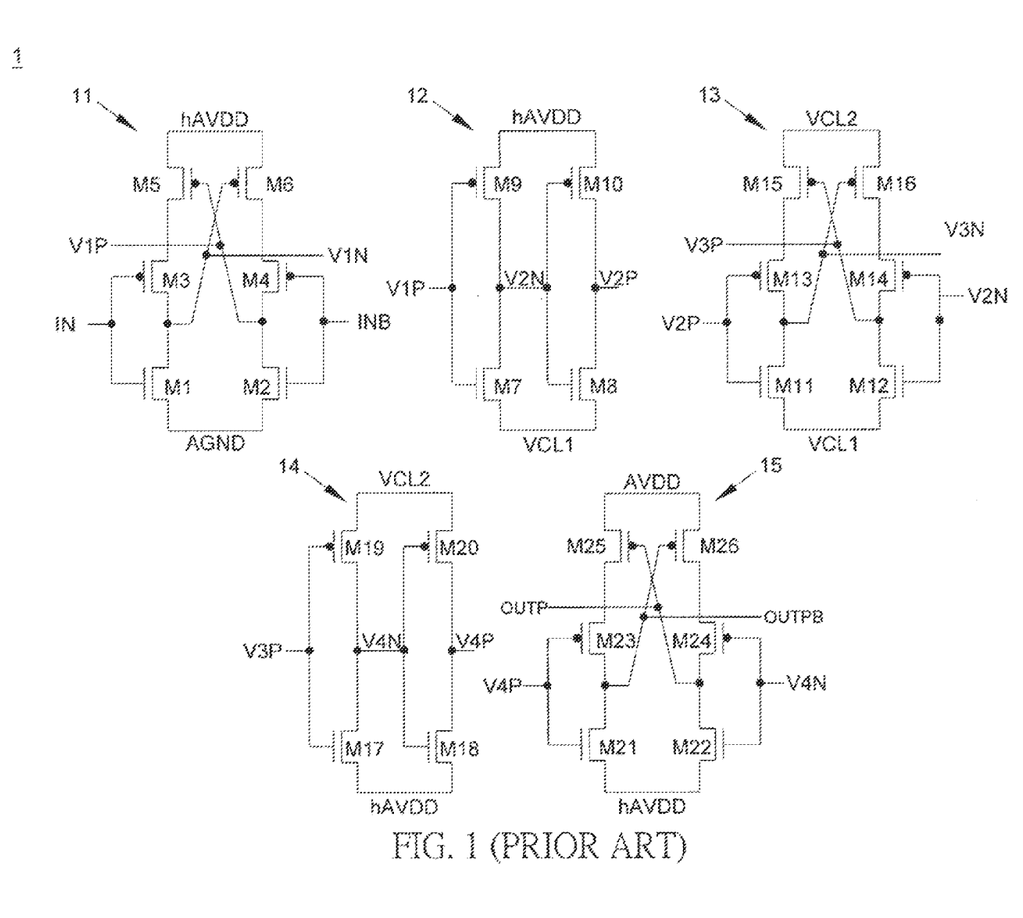
FIG. 1 illustrates a schematic diagram of the conventional level shifter in the driving circuit.

For example, as shown in FIG. 1, the conventional level shifter 1 includes five stages of level shifting unit 11~15, if input voltages of the input terminals IN and INB of the conventional level shifter 1 are 0~1.5 volts, the input voltages will be converted into output voltage signals OUTP and OUTB with voltages of 6~12 volts by the five stages of level shifting unit 11~15 in order, and then outputted by output terminals of the level shifter 1.

However, since 26 MOSFETs (e.g., M1~M26 in FIG. 1) are used in the conventional level shifter 1 and two additional voltage sources are necessary in the conventional level shifter 1 to provide two middle voltages VCL1 and VCL2 in the signal voltage level conversions, the cost of the conventional level shifter 1 becomes high and the circuit structure of the conventional level shifter 1 becomes very complicated. In addition, since the entire signal voltage level conversion process are performed in four stages in order, it is so time-consuming that the efficiency of the conventional level shifter 1 performing signal voltage level conversions in multi-power domain also becomes poor.

SUMMARY OF THE INVENTION

Therefore, the invention provides a level shifter of the driving circuit applied in the display and operating method thereof to solve the above-mentioned problems occurred in the prior arts.

A preferred embodiment of the invention is a level shifter. In this embodiment, the level shifter is applied in a driving circuit of a display and used for converting an input voltage signal with low voltage level into an output voltage signal with high voltage level. The level shifter includes a first stage of level shifting unit and a second stage of level shifting unit.

The first stage of level shifting unit includes a first transistor, a second transistor, a third transistor, a fourth transistor, a fifth transistor, a sixth transistor, a seventh transistor, and an eighth transistor. The first transistor, the second transistor, the third transistor, and the fourth transistor are N-type MOSFETs; the fifth transistor, the sixth transistor, the seventh transistor, and the eighth transistor are P-type MOSFETs. The first transistor, the third transistor, the fifth transistor, and the seventh transistor are coupled in series between a ground terminal and an operational voltage. The second transistor, the fourth transistor, the sixth transistor, and the eighth transistor are coupled in series between the ground terminal and the operational voltage. Gates of the first transistor and the second transistor are coupled to the input voltage signal. Gates of the third transistor, the fourth transistor, the fifth transistor, the sixth transistor are coupled to a half operational voltage which is half of the operational voltage. A gate of the seventh transistor is coupled to a first node between the sixth transistor and the eighth transistor. A gate of the eighth transistor is coupled to a second node between the fifth transistor and the seventh transistor.

The second stage of level shifting unit includes a ninth transistor, a tenth transistor, an eleventh transistor, and a twelfth transistor. The ninth transistor and the tenth transistor are N-type MOSFETs; the eleventh transistor and the twelfth transistor are P-type MOSFETs. The ninth transistor and the eleventh transistor are coupled in series between the half operational voltage and the operational voltage. The tenth transistor and the twelfth transistor are coupled in series between the half operational voltage and the operational voltage. A gate of the ninth transistor is coupled to a first output terminal between the tenth transistor and the twelfth transistor. A gate of the tenth transistor is coupled to a second output terminal between the ninth transistor and the eleventh transistor. A gate of the eleventh transistor is coupled to the first node. A gate of the twelfth transistor is coupled to the second node; the second stage of level shifting unit outputs the output voltage signal via the first output terminal and the second output terminal.

In an embodiment, the operational voltage is 12 volts and the half operational voltage is 6 volts; the voltage of the input voltage signal ranges from 0 to 1.5 volts and the voltage of the output voltage signal ranges from 6 to 12 volts.

In an embodiment, the first transistor, the second transistor, the third transistor, and the fourth transistor have a threshold voltage VTN and a breakdown voltage of 6 volts, the fifth transistor, the sixth transistor, the seventh transistor, and the eighth transistor have a threshold voltage VTP and a breakdown voltage of 6 volts, the first transistor and the second transistor are operated under a voltage ranging from 0 to (6−VTN) volts and have a cross-voltage less than 6 volts; the third transistor and the fourth transistor are operated under a voltage ranging from VTN to 6 volts and have a cross-voltage less than 6 volts; the fifth transistor and the sixth transistor are operated under a voltage ranging from 6 to (12−VTP) volts and have a cross-voltage less than 6 volts; the seventh transistor and the eighth transistor are operated under a voltage ranging from (6+VTP) to 12 volts and have a cross-voltage less than 6 volts, VTN and VTP are both larger than 0.

In an embodiment, the level shifter further includes another second stage of level shifting unit including a thirteenth transistor, a fourteenth transistor, a fifteenth transistor, and a sixteenth transistor, wherein the thirteenth transistor and the fourteenth transistor are N-type MOSFETs; the fifteenth transistor and the sixteenth transistor are P-type MOSFETs; the thirteenth transistor and the fifteenth transistor are coupled in series between the ground terminal and the half operational voltage; the fourteenth transistor and the sixteenth transistor are coupled in series between the ground terminal and the half operational voltage; a gate of the thirteenth transistor is coupled between the first transistor and the third transistor; a gate of the fourteenth transistor is coupled between the second transistor and the fourth transistor; a gate of the fifteenth transistor is coupled to a third output terminal between the fourteenth transistor and the sixteenth transistor; a gate of the sixteenth transistor is coupled to a fourth output terminal between the thirteenth transistor and the fifteenth transistor; a gate of the twelfth transistor is coupled to the second node; the another second stage of level shifting unit outputs another output voltage signal via the third output terminal and the fourth output terminal.

In an embodiment, the another output voltage signal and the output voltage signal have the same logic and different voltage ranges.

In an embodiment, the operational voltage is 12 volts, the half operational voltage is 6 volts, the voltage of the input voltage signal ranges from 0 to 1.5 volts, the voltage of the output voltage signal ranges from 6 to 12 volts, and the voltage of the another output voltage signal ranges from 0 to 6 volts.

Another preferred embodiment of the invention is a level shifter operating method. In this embodiment, the level shifter operating method is used for operating a level shifter in a driving circuit of a display to convert an input voltage signal with low voltage level into an output voltage signal with high voltage level. The level shifter includes a first stage of level shifting unit and a second stage of level shifting unit.

The first stage of level shifting unit includes a first transistor, a second transistor, a third transistor, a fourth transistor, a fifth transistor, a sixth transistor, a seventh transistor, and an eighth transistor. The second stage of level shifting unit includes a ninth transistor, a tenth transistor, an eleventh transistor, and a twelfth transistor. The first transistor, the second transistor, the third transistor, the fourth transistor, the ninth transistor, and the tenth transistor are N-type MOSFETs; the fifth transistor, the sixth transistor, the seventh transistor, the eighth transistor, the eleventh transistor, and the twelfth transistor are P-type MOSFETs. The first transistor, the third transistor, the fifth transistor, and the seventh transistor are coupled in series between a ground terminal and an operational voltage. The second transistor, the fourth transistor, the sixth transistor, and the eighth transistor are coupled in series between the ground terminal and the operational voltage. Gates of the third transistor, the fourth transistor, the fifth transistor, the sixth transistor are coupled to a half operational voltage which is half of the operational voltage. A gate of the seventh transistor is coupled to a first node between the sixth transistor and the eighth transistor. A gate of the eighth transistor is coupled to a second node between the fifth transistor and the seventh transistor. The ninth transistor and the eleventh transistor are coupled in series between the half operational voltage and the operational voltage. The tenth transistor and the twelfth transistor are coupled in series between the half operational voltage and the operational voltage. A gate of the ninth transistor is coupled to a first output terminal between the tenth transistor and the twelfth transistor. A gate of the tenth transistor is coupled to a second output terminal between the ninth transistor and the eleventh transistor. A gate of the eleventh transistor is coupled to the first node. A gate of the twelfth transistor is coupled to the second node.

The level shifter operating method includes steps of: (a) receiving the output voltage signal via gates of the first transistor and the second transistor; (b) receiving a first voltage signal and a second voltage signal from the first node and the second node respectively via the eleventh transistor and the twelfth transistor; and (c) outputting the output voltage signal via the first output terminal and the second output terminal.

Another preferred embodiment of the invention is a level shifter. In this embodiment, the level shifter is applied in a driving circuit of a display and used for converting an input voltage signal with low voltage level into an output voltage signal with high voltage level. The level shifter includes a first stage of level shifting unit and a second stage of level shifting unit.

The first stage of level shifting unit includes a first transistor, a second transistor, a third transistor, a fourth transistor, a fifth transistor, a sixth transistor, a seventh transistor, an eighth transistor, a ninth transistor, a ninth transistor, a tenth transistor, an eleventh transistor, and a twelfth transistor. The first transistor, the second transistor, the third transistor, the fourth transistor, the ninth transistor, and the tenth transistor are N-type MOSFETs; the fifth transistor, the sixth transistor, the seventh transistor, the eighth transistor, the eleventh transistor, and the twelfth transistor are P-type MOSFETs. The first transistor, the third transistor, the fifth transistor, and the seventh transistor are coupled in series between a ground terminal and a middle voltage. The second transistor, the fourth transistor, the sixth transistor, and the eighth transistor are coupled in series between the ground terminal and a first middle voltage. Gates of the first transistor and the second transistor are coupled to the input voltage signal. Gates of the third transistor, the fourth transistor, the fifth transistor, the sixth transistor are coupled to a second middle voltage which is smaller than the first middle voltage. Gates of the first transistor, the second transistor, the third transistor, and the fourth transistor are coupled to the first middle voltage. A gate of the seventh transistor is coupled to a first node between the sixth transistor and the eighth transistor. A gate of the eighth transistor is coupled to a second node between the fifth transistor and the seventh transistor. The ninth transistor and the eleventh transistor are coupled in series between a half operational voltage and the first middle voltage. The tenth transistor and the twelfth transistor are coupled in series between the half operational voltage and the first middle voltage. Gates of the ninth transistor and the tenth transistor are both coupled to the second node between the fifth transistor and the seventh transistor. Gates of the eleventh transistor and the twelfth transistor are both coupled to the first node between the sixth transistor and the eighth transistor. The gates of the ninth transistor and the tenth transistor are coupled to the half operational voltage respectively. The gates of the eleventh transistor and the twelfth transistor are coupled to the first middle voltage respectively.

The second stage of level shifting unit includes a thirteenth transistor, a fourteenth transistor, a fifteenth transistor, a sixteenth transistor, a seventeenth transistor, and an eighteenth transistor. The thirteenth transistor and the fourteenth transistor are N-type MOSFETs; the fifteenth transistor, the sixteenth transistor, the seventeenth transistor, and the eighteenth transistor are P-type MOSFETs. The thirteenth transistor, the fifteenth transistor, and the seventeenth transistor are coupled in series between the half operational voltage and an operational voltage, and the half operational voltage is half of the operational voltage. The fourteenth transistor, the sixteenth transistor, and the eighteenth transistor are coupled in series between the half operational voltage and the operational voltage. Gates of the thirteenth transistor and the fourteenth transistor are coupled to the half operational voltage; gates of the fifteenth transistor, the sixteenth transistor, the seventeenth transistor, the eighteenth transistor are coupled to the eighteenth transistor. Gates of the thirteenth transistor and the fifteenth transistor are coupled to a third node between the ninth transistor and the eleventh transistor. Gates of the fourteenth transistor and the sixteenth transistor are coupled to a fourth node between the tenth transistor and the twelfth transistor. The seventeenth transistor is coupled to a fifth node between the fourteenth transistor and the sixteenth transistor via a first output terminal. The eighteenth transistor is coupled to a sixth node between the thirteenth transistor and the fifteenth transistor via a second output terminal. The second stage of level shifting unit outputs the output voltage signal via the first output terminal and the second output terminal.

Another preferred embodiment of the invention is a level shifter operating method. In this embodiment, the level shifter operating method is used for operating a level shifter in a driving circuit of a display to convert an input voltage signal with low voltage level into an output voltage signal with high voltage level. The level shifter includes a first stage of level shifting unit and a second stage of level shifting unit.

The first stage of level shifting unit includes a first transistor, a second transistor, a third transistor, a fourth transistor, a fifth transistor, a sixth transistor, a seventh transistor, an eighth transistor, a ninth transistor, a tenth transistor, an eleventh transistor, and a twelfth transistor. The first transistor, the second transistor, the third transistor, the fourth transistor, the ninth transistor, and the tenth transistor are N-type MOSFETs; the fifth transistor, the sixth transistor, the seventh transistor, the eighth transistor, the eleventh transistor, and the twelfth transistor are P-type MOSFETs. The first transistor, the third transistor, the fifth transistor, and the seventh transistor are coupled in series between a ground terminal and a first middle voltage. The second transistor, the fourth transistor, the sixth transistor, and the eighth transistor are coupled in series between the ground terminal and the first middle voltage. Gates of the first transistor and the second transistor being coupled to the input voltage signal. Gates of the third transistor, the fourth transistor, the fifth transistor, the sixth transistor are coupled to a second middle voltage which is smaller than the first middle voltage. Gates of the first transistor, the second transistor, the third transistor, and the fourth transistor are coupled to the ground terminal. Gates of the fifth transistor, the sixth transistor, the seventh transistor, and the eighth transistor are coupled to the first middle voltage. A gate of the seventh transistor is coupled to a first node between the sixth transistor and the eighth transistor. A gate of the eighth transistor is coupled to a second node between the fifth transistor and the seventh transistor. Gates of the ninth transistor and the tenth transistor are coupled to the second node between the fifth transistor and the seventh transistor. Gates of the eleventh transistor and the twelfth transistor are coupled to the first node between the sixth transistor and the eighth transistor. The gates of the ninth transistor and the tenth transistor are coupled to the half operational voltage respectively. The gates of the eleventh transistor and the twelfth transistor are coupled to the first middle voltage respectively. The second stage of level shifting unit includes a thirteenth transistor, a fourteenth transistor, a fifteenth transistor, a sixteenth transistor, a seventeenth transistor, and an eighteenth transistor. The thirteenth transistor and the fourteenth transistor are N-type MOSFETs; the fifteenth transistor, the sixteenth transistor, the seventeenth transistor, and the eighteenth transistor are P-type MOSFETs. The thirteenth transistor, the fifteenth transistor, and the seventeenth transistor are coupled in series between the half operational voltage and an operational voltage, and the half operational voltage is half of the operational voltage. The fourteenth transistor, the sixteenth transistor, and the eighteenth transistor are coupled in series between the half operational voltage and the operational voltage. Gates of the thirteenth transistor and the fourteenth transistor are coupled to the half operational voltage. Gates of the fifteenth transistor, the sixteenth transistor, the seventeenth transistor, the eighteenth transistor are coupled to the operational voltage. Gates of the thirteenth transistor and the fifteenth transistor are coupled to a third node between the ninth transistor and the eleventh transistor. Gates of the fourteenth transistor and the sixteenth transistor are coupled to a fourth node between the tenth transistor and the twelfth transistor. The seventeenth transistor is coupled to a fifth node between the fourteenth transistor and the sixteenth transistor via a first output terminal. The eighteenth transistor is coupled to a sixth node between the thirteenth transistor and the fifteenth transistor via a second output terminal. The second stage of level shifting unit outputs the output voltage signal via the first output terminal and the second output terminal.

The level shifter operating method includes steps of: (a) receiving the output voltage signal via gates of the first transistor and the second transistor; (b) receiving a first voltage signal from the third node between the ninth transistor and the eleventh transistor via gates of the thirteenth transistor and the fifteenth transistor and receiving a second voltage signal from the fourth node between the tenth transistor and the twelfth transistor via gates of the fourteenth transistor and the sixteenth transistor; and (c) outputting the output voltage signal via the first output terminal and the second output terminal.

Compared to the prior arts, the level shifter of the driving circuit and the level shifter operating method in the invention have following advantages.

(1) Since fewer MOSFETs are necessary for the level shifter of the invention than the conventional level shifter and no additional voltage source is necessary for the level shifter of the invention to provide middle voltages, the cost of the level shifter can be reduced and the circuit structure of the level shifter can be simplified.

(2) Since only two stages of level shifting unit are necessary for the level shifter of the invention to finish the entire signal voltage level conversion process, it is time-saving and the efficiency of the level shifter performing signal voltage level conversions in multi-power domain can be enhanced.

(3) The area of the circuit layout in the level shifter of the invention can be reduced by suitable coupling and design of the MOSFETs in the first stage of level shifting unit.

The advantage and spirit of the invention may be understood by the following detailed descriptions together with the appended drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 2:
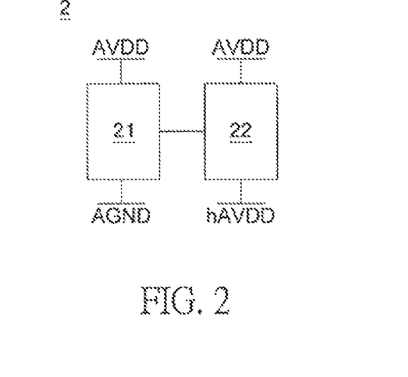
FIG. 2 illustrates a functional block diagram of the level shifter in a preferred embodiment of the invention.

A preferred embodiment of the invention is a level shifter of a driving circuit. In this embodiment, the level shifter is applied in the driving circuit of a display, but not limited to this. At first, please refer to FIG. 2. FIG. 2 illustrates a functional block diagram of the level shifter in this embodiment. As shown in FIG. 2, the level shifter 2 includes a first stage of level shifting unit 21 and a second stage of level shifting unit 22. Wherein, the first stage of level shifting unit 21 is coupled between a ground terminal AGND and an operational voltage AVDD; the second stage of level shifting unit 22 is coupled between a half operational voltage hAVDD and the operational voltage AVDD; the first stage of level shifting unit 21 is coupled to the second stage of level shifting unit 22.

Figure 3:
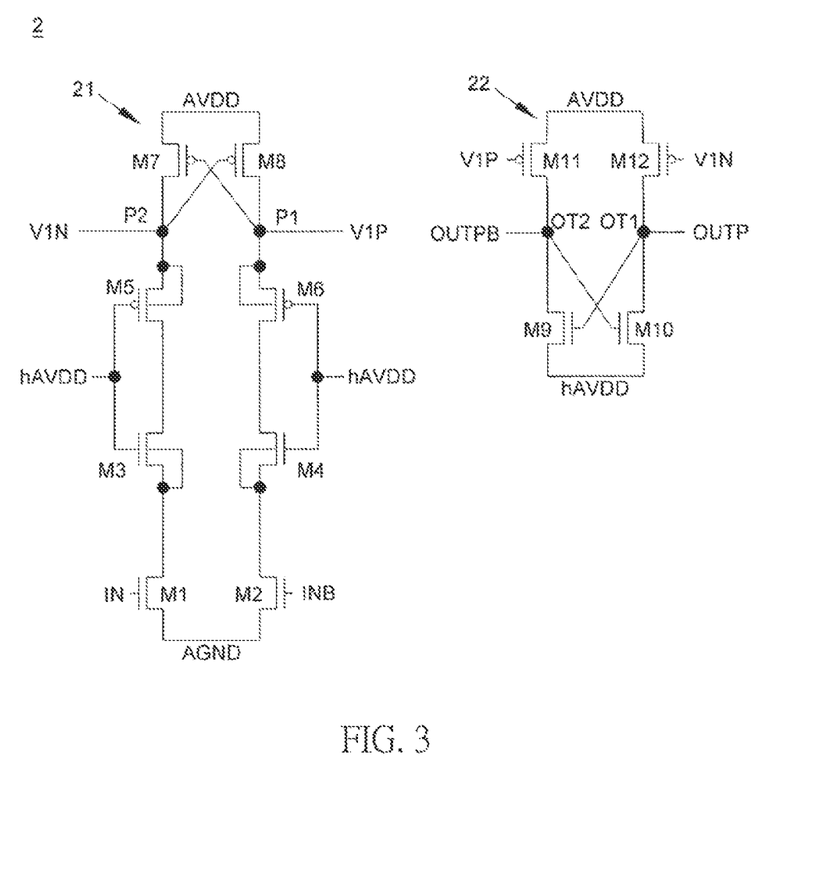
FIG. 3 illustrates a detailed circuit diagram of the level shifter of FIG. 2.

Next, please refer to FIG. 3. FIG. 3 illustrates a detailed circuit diagram of the level shifter 2 of FIG. 2. As shown in FIG. 3, the first stage of level shifting unit 21 in the level shifter 2 includes a first transistor M1, a second transistor M2, a third transistor M3, a fourth transistor M4, a fifth transistor M5, a sixth transistor M6, a seventh transistor M7, and an eighth transistor M8. Wherein, the first transistor M1, the second transistor M2, the third transistor M3, and the fourth transistor M4 are N-type MOSFETs; the fifth transistor M5, the sixth transistor M6, the seventh transistor M7, and the eighth transistor M8 are P-type MOSFETs.

In this embodiment, the first transistor M1, the third transistor M3, the fifth transistor M5, and the seventh transistor M7 are coupled in series between the ground terminal AGND and the operational voltage AVDD; the second transistor M2, the fourth transistor M4, the sixth transistor M6, and the eighth transistor M8 are coupled in series between the ground terminal AGND and the operational voltage AVDD. Gates of the first transistor M1 and the second transistor M2 are coupled to input voltage signals IN and INB; gates of the third transistor M3, the fourth transistor M4, the fifth transistor M5, and the sixth transistor M6 are coupled to the half operational voltage hAVDD. The half operational voltage hAVDD is half of the operational voltage AVDD. A base of the third transistor M3 is coupled between the first transistor M1 and the third transistor M3; a base of the fourth transistor M4 is coupled between the second transistor M2 and the fourth transistor M4; a base of the fifth transistor M5 is coupled between the seventh transistor M7 and the fifth transistor M5; a base of the sixth transistor M6 is coupled between the eighth transistor M8 and the sixth transistor M6. A gate of the seventh transistor M7 is coupled to a first node P1 between the sixth transistor M6 and the eighth transistor M8. A gate of the eighth transistor M8 is coupled to a second node P2 between the fifth transistor M5 and the seventh transistor M7.

The second stage of level shifting unit 22 in the level shifter 2 includes a ninth transistor M9, a tenth transistor M10, an eleventh transistor M11, and a twelfth transistor M12. The ninth transistor M9 and the tenth transistor M10 are N-type MOSFETs; the eleventh transistor M11 and the twelfth transistor M12 are P-type MOSFETs. The ninth transistor M9 and the eleventh transistor M11 are coupled in series between the half operational voltage hAVDD and the operational voltage AVDD. The tenth transistor M10 and the twelfth transistor M12 are coupled in series between the half operational voltage hAVDD and the operational voltage AVDD. A gate of the ninth transistor M9 is coupled to a first output terminal OT1 between the tenth transistor M10 and the twelfth transistor M12. A gate of the tenth transistor M10 is coupled to a second output terminal OT2 between the ninth transistor M9 and the eleventh transistor M11. A gate of the eleventh transistor M11 is coupled to the first node P1 in the first stage of level shifting unit 21 to receive a first voltage signal V1P from the first node P1. A gate of the twelfth transistor M12 is coupled to the second node P2 in the first stage of level shifting unit 21 to receive a second voltage signal V1N from the second node P2.

The second stage of level shifting unit 22 outputs output voltage signals OUTP and OUTPB via the first output terminal OT1 and the second output terminal OT2 respectively.

In practical applications, if the operational voltage AVDD is 12 volts and the half operational voltage hAVDD is 6 volts, the voltages of the input voltage signals IN and INB range from 0 to 1.5 volts, and the voltages of the output voltage signals OUTP and OUTPB range from 6 to 12 volts. The first transistor M1, the second transistor M2, the third transistor M3, and the fourth transistor M4 have a threshold voltage VTN larger than 0 and a breakdown voltage of 6 volts. The fifth transistor M5, the sixth transistor M6, the seventh transistor M7, and the eighth transistor M8 have a threshold voltage VTP larger than 0 and a breakdown voltage of 6 volts. The first transistor M1 and the second transistor M2 are operated under a voltage ranging from 0 to (6−VTN) volts and have a cross-voltage less than 6 volts since VTN is larger than 0. The third transistor M3 and the fourth transistor M4 are operated under a voltage ranging from VTN to 6 volts and have a cross-voltage less than 6 volts. The fifth transistor M5 and the sixth transistor M6 are operated under a voltage ranging from 6 to (12−VTP) volts and have a cross-voltage less than 6 volts. The seventh transistor M7 and the eighth transistor M8 are operated under a voltage ranging from (6+VTP) to 12 volts and have a cross-voltage less than 6 volts.

It should be noticed that the breakdown voltage between the gate and the base/source/drain of the P-type MOSFETs M5~M8 is 6 volts, and the breakdown voltage between the source/drain and the base of the P-type MOSFETs M5~M8 is 10 volts. The breakdown voltage between the gate and the base/source/drain of the N-type MOSFETs M1~M4 is 6 volts, and the breakdown voltage between the source/drain and the base of the N-type MOSFETs M1~M4 is 11 volts.

Above all, it can be found that only twelve transistors (the first transistor M1~the twelfth transistor M12) in the two stages of level shifting unit (the first stage of level shifting unit 21 and the second stage of level shifting unit 22) are necessary for the level shifter 2 of the invention to finish the entire signal voltage level conversion process. It is much less transistors and stages of level shifting unit used in the level shifter 2 of the invention than the twenty-six transistors and the five stages of level shifting unit 11~15 in the conventional level shifter 1 shown in FIG. 1. No additional voltage source is necessary for the level shifter of the invention to provide middle voltages, the cost of the level shifter can be reduced and the efficiency of the level shifter 2 performing signal voltage level conversions in multi-power domain can be enhanced.

Figure 4:
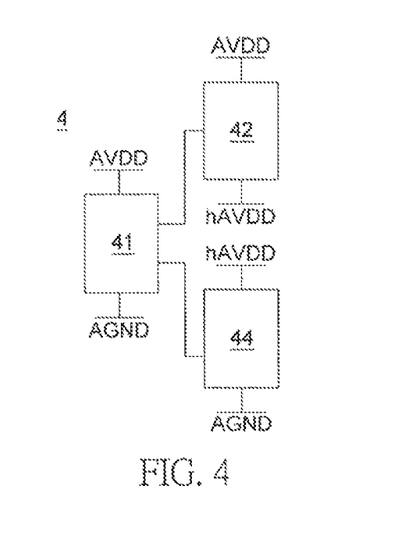
FIG. 4 illustrates a functional block diagram of the level shifter in another preferred embodiment of the invention.

Another preferred embodiment of the invention is a level shifter of a driving circuit. In this embodiment, the level shifter is applied in the driving circuit of a display, but not limited to this. At first, please refer to FIG. 4. FIG. 4 illustrates a functional block diagram of the level shifter in this embodiment. As shown in FIG. 4, the level shifter 4 includes a first stage of level shifting unit 41 and two second stages of level shifting unit 42 and 44. Wherein, the first stage of level shifting unit 41 is coupled between a ground terminal AGND and an operational voltage AVDD; the second stage of level shifting unit 42 is coupled between a half operational voltage hAVDD and the operational voltage AVDD; the second stage of level shifting unit 44 is coupled between the ground terminal AGND and the half operational voltage hAVDD; the first stage of level shifting unit 21 is coupled to the two second stages of level shifting unit 42 and 44.

Figure 5:
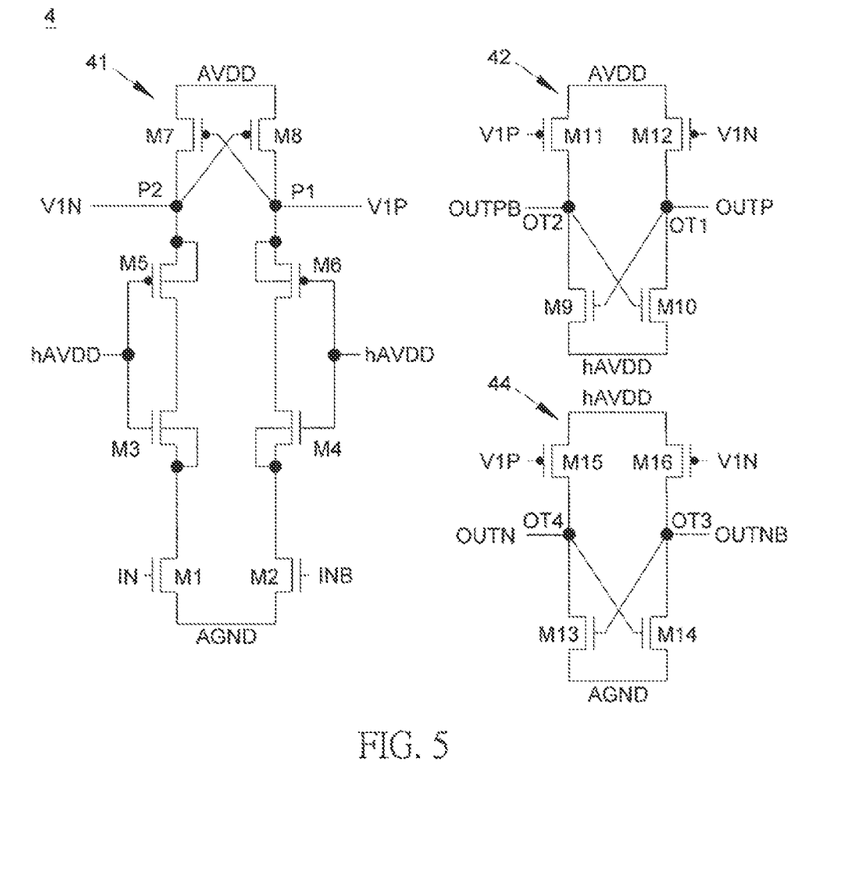
FIG. 5 illustrates a detailed circuit diagram of the level shifter of FIG. 4.

Next, please refer to FIG. 5. FIG. 5 illustrates a detailed circuit diagram of the level shifter 4 of FIG. 4. As shown in FIG. 5, the first stage of level shifting unit 41 in the level shifter 4 includes a first transistor M1, a second transistor M2, a third transistor M3, a fourth transistor M4, a fifth transistor M5, a sixth transistor M6, a seventh transistor M7, and an eighth transistor M8. Wherein, the first transistor M1, the second transistor M2, the third transistor M3, and the fourth transistor M4 are N-type MOSFETs; the fifth transistor M5, the sixth transistor M6, the seventh transistor M7, and the eighth transistor M8 are P-type MOSFETs.

In this embodiment, the first transistor M1, the third transistor M3, the fifth transistor M5, and the seventh transistor M7 are coupled in series between the ground terminal AGND and the operational voltage AVDD; the second transistor M2, the fourth transistor M4, the sixth transistor M6, and the eighth transistor M8 are coupled in series between the ground terminal AGND and the operational voltage AVDD. Gates of the first transistor M1 and the second transistor M2 are coupled to input voltage signals IN and INB; gates of the third transistor M3, the fourth transistor M4, the fifth transistor M5, and the sixth transistor M6 are coupled to the half operational voltage hAVDD. The half operational voltage hAVDD is half of the operational voltage AVDD. A base of the third transistor M3 is coupled between the first transistor M1 and the third transistor M3; a base of the fourth transistor M4 is coupled between the second transistor M2 and the fourth transistor M4; a base of the fifth transistor M5 is coupled between the seventh transistor M7 and the fifth transistor M5; a base of the sixth transistor M6 is coupled between the eighth transistor M8 and the sixth transistor M6. A gate of the seventh transistor M7 is coupled to a first node P1 between the sixth transistor M6 and the eighth transistor M8. A gate of the eighth transistor M8 is coupled to a second node P2 between the fifth transistor M5 and the seventh transistor M7.

The second stage of level shifting unit 42 in the level shifter 4 includes a ninth transistor M9, a tenth transistor M10, an eleventh transistor M11, and a twelfth transistor M12. The ninth transistor M9 and the tenth transistor M10 are N-type MOSFETs; the eleventh transistor M11 and the twelfth transistor M12 are P-type MOSFETs. The ninth transistor M9 and the eleventh transistor M11 are coupled in series between the half operational voltage hAVDD and the operational voltage AVDD. The tenth transistor M10 and the twelfth transistor M12 are coupled in series between the half operational voltage hAVDD and the operational voltage AVDD. A gate of the ninth transistor M9 is coupled to a first output terminal OT1 between the tenth transistor M10 and the twelfth transistor M12. A gate of the tenth transistor M10 is coupled to a second output terminal OT2 between the ninth transistor M9 and the eleventh transistor M11. A gate of the eleventh transistor M11 is coupled to the first node P1 in the first stage of level shifting unit 41. A gate of the twelfth transistor M12 is coupled to the second node P2 in the first stage of level shifting unit 41. The second stage of level shifting unit 42 outputs output voltage signals OUTP and OUTPB via the first output terminal OT1 and the second output terminal OT2 respectively.

The second stage of level shifting unit 44 in the level shifter 4 includes a thirteenth transistor M13, a fourteenth transistor M14, an fifteenth transistor M15, and a sixteenth transistor M16. The thirteenth transistor M13 and the fourteenth transistor M14 are N-type MOSFETs; the fifteenth transistor M15 and the sixteenth transistor M16 are P-type MOSFETs. The thirteenth transistor M13 and the fifteenth transistor M15 are coupled in series between the ground terminal AGND and the half operational voltage hAVDD. The fourteenth transistor M14 and the sixteenth transistor M16 are coupled in series between the ground terminal AGND and the half operational voltage hAVDD. A gate of the thirteenth transistor M13 is coupled between the first transistor M1 and the third transistor M3. A gate of the fourteenth transistor M14 is coupled between the second transistor M2 and the fourth transistor M4. A gate of the fifteenth transistor M15 is coupled to a third output terminal OT3 between the fourteenth transistor M14 and the sixteenth transistor M16. A gate of the sixteenth transistor M16 is coupled to a fourth output terminal OT4 between the thirteenth transistor M13 and the fifteenth transistor M15. The second stage of level shifting unit 44 outputs output voltage signals OUTN and OUTNB via the third output terminal OT3 and the fourth output terminal OT4 respectively.

In practical applications, if the operational voltage AVDD is 12 volts and the half operational voltage hAVDD is 6 volts, the voltages of the input voltage signals IN and INB range from 0 to 1.5 volts, and the voltages of the output voltage signals OUTP and OUTPB range from 6 to 12 volts. The first transistor M1, the second transistor M2, the third transistor M3, and the fourth transistor M4 have a threshold voltage VTN larger than 0 and a breakdown voltage of 6 volts. The fifth transistor M5, the sixth transistor M6, the seventh transistor M7, and the eighth transistor M8 have a threshold voltage VTP larger than 0 and a breakdown voltage of 6 volts. The first transistor M1 and the second transistor M2 are operated under a voltage ranging from 0 to (6−VTN) volts and have a cross-voltage less than 6 volts since VTN is larger than 0. The third transistor M3 and the fourth transistor M4 are operated under a voltage ranging from VTN to 6 volts and have a cross-voltage less than 6 volts. The fifth transistor M5 and the sixth transistor M6 are operated under a voltage ranging from 6 to (12−VTP) volts and have a cross-voltage less than 6 volts. The seventh transistor M7 and the eighth transistor M8 are operated under a voltage ranging from (6+VTP) to 12 volts and have a cross-voltage less than 6 volts.

In fact, the breakdown voltage between the gate and the base/source/drain of the P-type MOSFETs M5~M8 is 6 volts, and the breakdown voltage between the source/drain and the base of the P-type MOSFETs M5~M8 is 10 volts. The breakdown voltage between the gate and the base/source/drain of the N-type MOSFETs M1~M4 is 6 volts, and the breakdown voltage between the source/drain and the base of the N-type MOSFETs M1~M4 is 11 volts.

The output voltage signals OUTN and OUTNB outputted by the second stage of level shifting unit 44 via the third output terminal OT3 and the fourth output terminal OT4 have the same logic and different voltage ranges with the output voltage signals OUTN and OUTNB outputted by the second stage of level shifting unit 42 via the first output terminal OT1 and the second output terminal OT2.

For example, the voltages of the output voltage signals OUTN and OUTNB outputted by the second stage of level shifting unit 42 via the first output terminal OT1 and the second output terminal OT2 range from 6 to 12 volts; the voltages of the output voltage signals OUTN and OUTNB outputted by the second stage of level shifting unit 44 via the third output terminal OT3 and the fourth output terminal OT4 range from 0 to 6 volts.

Above all, it can be found that only sixteen transistors (the first transistor M1~the sixteenth transistor M16) in the two stages of level shifting unit (the first stage of level shifting unit 41 and the two second stages of level shifting unit 42 and 44) are necessary for the level shifter 4 of the invention to finish the entire signal voltage level conversion process, and the two second stages of level shifting unit 42 and 44 output the output voltage signals having the same logic and different voltage ranges respectively. It is much less transistors and stages of level shifting unit used in the level shifter 4 of the invention than the twenty-six transistors and the five stages of level shifting unit 11~15 in the conventional level shifter 1 shown in FIG. 1. No additional voltage source is necessary for the level shifter of the invention to provide middle voltages, the cost of the level shifter can be reduced and the efficiency of the level shifter 4 performing signal voltage level conversions in multi-power domain can be enhanced.

Another preferred embodiment of the invention is a level shifter operating method. In this embodiment, the level shifter operating method is used for operating a level shifter in a driving circuit of a display to convert an input voltage signal with low voltage level into an output voltage signal with high voltage level. The level shifter includes a first stage of level shifting unit and a second stage of level shifting unit.

The first stage of level shifting unit includes a first transistor, a second transistor, a third transistor, a fourth transistor, a fifth transistor, a sixth transistor, a seventh transistor, and an eighth transistor. The second stage of level shifting unit includes a ninth transistor, a tenth transistor, an eleventh transistor, and a twelfth transistor. The first transistor, the second transistor, the third transistor, the fourth transistor, the ninth transistor, and the tenth transistor are N-type MOSFETs; the fifth transistor, the sixth transistor, the seventh transistor, the eighth transistor, the eleventh transistor, and the twelfth transistor are P-type MOSFETs.

The first transistor, the third transistor, the fifth transistor, and the seventh transistor are coupled in series between a ground terminal and an operational voltage. The second transistor, the fourth transistor, the sixth transistor, and the eighth transistor are coupled in series between the ground terminal and the operational voltage. Gates of the third transistor, the fourth transistor, the fifth transistor, the sixth transistor are coupled to a half operational voltage which is half of the operational voltage. A gate of the seventh transistor is coupled to a first node between the sixth transistor and the eighth transistor. A gate of the eighth transistor is coupled to a second node between the fifth transistor and the seventh transistor. The ninth transistor and the eleventh transistor are coupled in series between the half operational voltage and the operational voltage. The tenth transistor and the twelfth transistor are coupled in series between the half operational voltage and the operational voltage. A gate of the ninth transistor is coupled to a first output terminal between the tenth transistor and the twelfth transistor. A gate of the tenth transistor is coupled to a second output terminal between the ninth transistor and the eleventh transistor. A gate of the eleventh transistor is coupled to the first node. A gate of the twelfth transistor is coupled to the second node.

Figure 6:
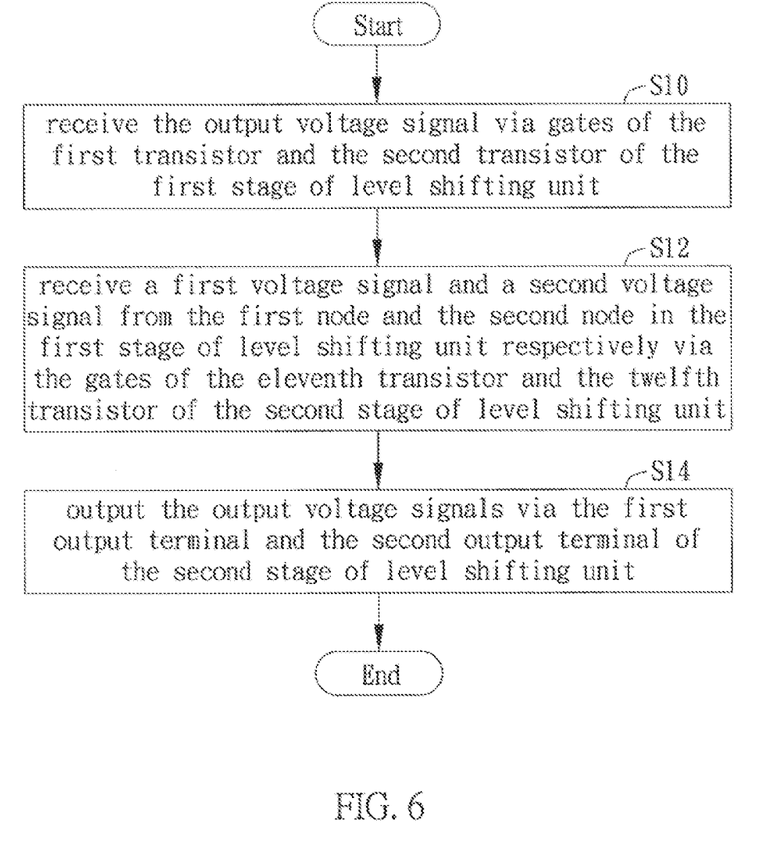
FIG. 6 illustrates a flow chart of the level shifter operating method in another preferred embodiment of the invention.

Please refer to FIG. 6. FIG. 6 illustrates a flow chart of the level shifter operating method in this embodiment. As shown in FIG. 6, at first, in the step S10, the method receives the output voltage signal via gates of the first transistor and the second transistor of the first stage of level shifting unit. Then, in the step S12, the method receives a first voltage signal and a second voltage signal from the first node and the second node in the first stage of level shifting unit respectively via the gates of the eleventh transistor and the twelfth transistor of the second stage of level shifting unit. Then, in the step S14, the method outputs the output voltage signals via the first output terminal and the second output terminal of the second stage of level shifting unit.

Figure 7:
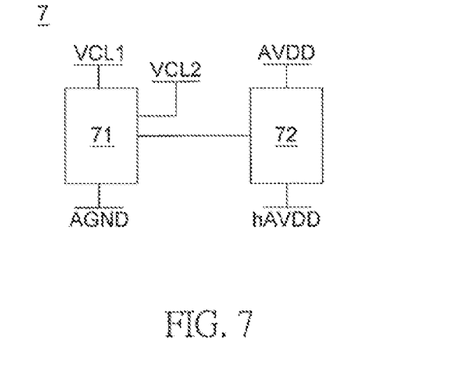
FIG. 7 illustrates a functional block diagram of the level shifter in another preferred embodiment of the invention.

Another preferred embodiment of the invention is a level shifter of a driving circuit. In this embodiment, the level shifter is applied in the driving circuit of a display, but not limited to this. At first, please refer to FIG. 7. FIG. 7 illustrates a functional block diagram of the level shifter in this embodiment. As shown in FIG. 7, the level shifter 7 includes a first stage of level shifting unit 71 and a second stage of level shifting unit 72. Wherein, the first stage of level shifting unit 71 is coupled between a ground terminal AGND and a first middle voltage VCL1; the second stage of level shifting unit 72 is coupled between a half operational voltage hAVDD and an operational voltage AVDD; the first stage of level shifting unit 71 is coupled to the second stage of level shifting unit 72.

Figure 8:
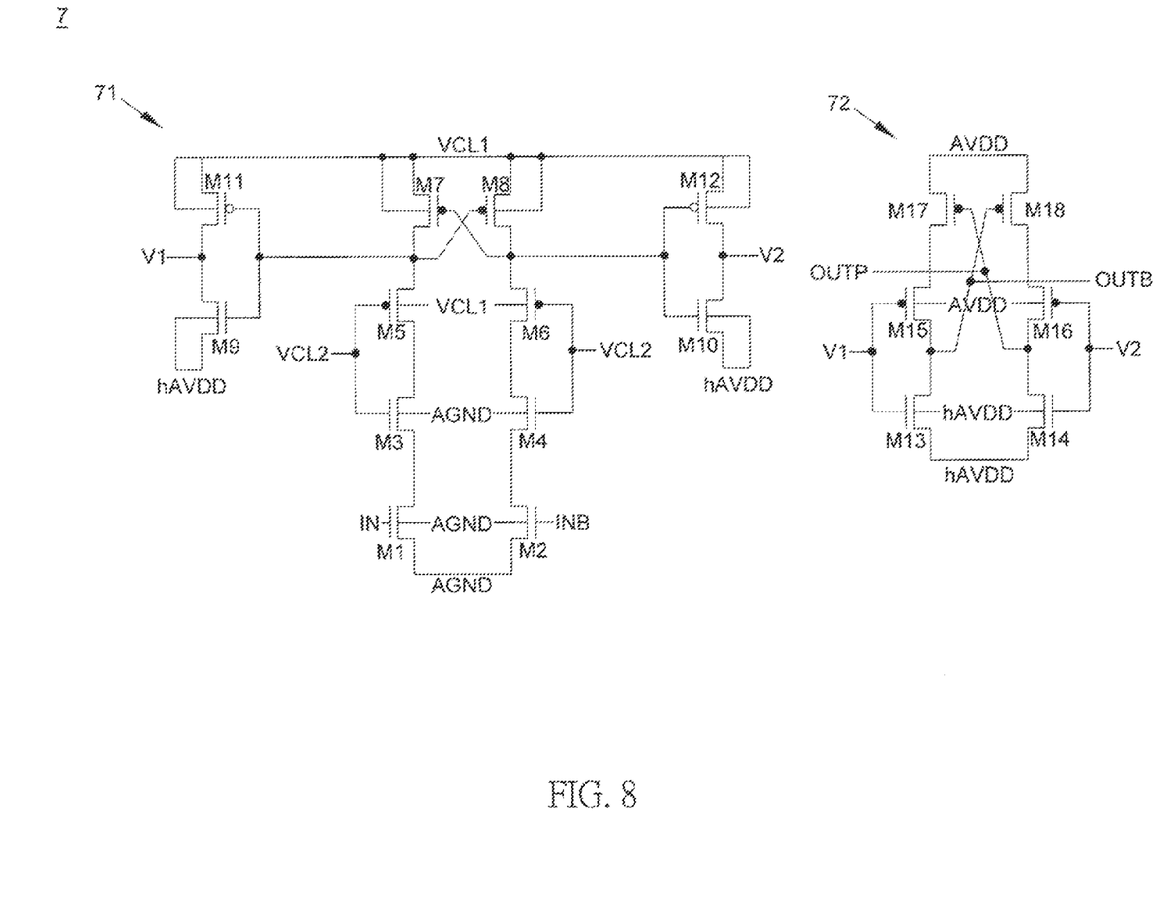
FIG. 8 illustrates a detailed circuit diagram of the level shifter of FIG. 7.

Next, please refer to FIG. 8. FIG. 8 illustrates a detailed circuit diagram of the level shifter 7 of FIG. 7. As shown in FIG. 8, the first stage of level shifting unit 71 in the level shifter 7 includes a first transistor M1, a second transistor M2, a third transistor M3, a fourth transistor M4, a fifth transistor M5, a sixth transistor M6, a seventh transistor M7, an eighth transistor M8, a ninth transistor M9, a tenth transistor M10, an eleventh transistor M11, and a twelfth transistor M12. Wherein, the first transistor M1, the second transistor M2, the third transistor M3, the fourth transistor M4, the ninth transistor M9, and the tenth transistor M10 are N-type MOSFETs; the fifth transistor M5, the sixth transistor M6, the seventh transistor M7, the eighth transistor M8, an eleventh transistor M11, and a twelfth transistor M12 are P-type MOSFETs.

The first transistor M1, the third transistor M3, the fifth transistor M5, and the seventh transistor M7 are coupled in series between the ground terminal AGND and the first middle voltage VCL1; the second transistor M2, the fourth transistor M4, the sixth transistor M6, and the eighth transistor M8 are coupled in series between the ground terminal AGND and the first middle voltage VCL1. Gates of the first transistor M1 and the second transistor M2 are coupled to input voltage signals IN and INB; gates of the third transistor M3, the fourth transistor M4, the fifth transistor M5, and the sixth transistor M6 are coupled to the second middle voltage VCL2 smaller than the first middle voltage VCL1.

Gates of the first transistor M1, the second transistor M2, the third transistor M3, and the fourth transistor M4 are all coupled to the ground terminal AGND. Gates of the fifth transistor M5, the sixth transistor M6, the seventh transistor M7, and the eighth transistor M8 are all coupled to the first middle voltage VCL1. A gate of the seventh transistor M7 is coupled between the sixth transistor M6 and the eighth transistor M8. A gate of the eighth transistor M8 is coupled between the fifth transistor M5 and the seventh transistor M7. The ninth transistor M9 and the eleventh transistor M11 are coupled in series between the half operational voltage hAVDD and the first middle voltage VCL1. The tenth transistor M10 and the twelfth transistor M12 are coupled in series between the half operational voltage hAVDD and the first middle voltage VCL1. The ninth transistor M9 and the tenth transistor M10 are coupled between the fifth transistor M5 and the seventh transistor M7. Gates of the eleventh transistor M11 and the twelfth transistor M12 are coupled between the sixth transistor M6 and the eighth transistor M8. Gates of the ninth transistor M9 and the tenth transistor M10 are coupled to the half operational voltage hAVDD respectively. Gates of the eleventh transistor M11 and the twelfth transistor M12 are coupled to the first middle voltage VCL1 respectively.

The second stage of level shifting unit 72 includes a thirteenth transistor M13, a fourteenth transistor M14, an fifteenth transistor M15, a sixteenth transistor M16, a seventeenth transistor M17, and an eighteenth transistor M18. The thirteenth transistor M13 and the fourteenth transistor M14 are N-type MOSFETs; the fifteenth transistor M15, the sixteenth transistor M16, the seventeenth transistor M17, and the eighteenth transistor M18 are P-type MOSFETs.

The thirteenth transistor M13, the fifteenth transistor M15, and the seventeenth transistor M17 are coupled in series between the half operational voltage hAVDD and the operational voltage AVDD. The half operational voltage hAVDD is half of the operational voltage AVDD. The fourteenth transistor M14, the sixteenth transistor M16, and the eighteenth transistor M18 are coupled in series between the half operational voltage hAVDD and the operational voltage AVDD. Gates of the thirteenth transistor M13 and the fourteenth transistor M14 are coupled to the half operational voltage hAVDD. Gates of the fifteenth transistor M15, the sixteenth transistor M16, the seventeenth transistor M17, and the eighteenth transistor M18 are coupled to the operational voltage AVDD. Gates of the thirteenth transistor M13 and the fifteenth transistor M15 are coupled between the ninth transistor M9 and the eleventh transistor M11. Gates of the fourteenth transistor M14 and the sixteenth transistor M16 are coupled between the tenth transistor M10 and the twelfth transistor M12. The seventeenth transistor M17 is coupled between the fourteenth transistor M14 and the sixteenth transistor M16 through a first output terminal OUTP. The eighteenth transistor M18 is coupled between the thirteenth transistor M13 and the fifteenth transistor M15 through a second output terminal OUTB. The second stage of level shifting unit 72 outputs output voltage signals via the first output terminal OUTP and the second output terminal OUTB.

In an embodiment, if the operational voltage AVDD is 12 volts and the half operational voltage hAVDD is 6 volts, the voltages of the input voltage signals IN and INB range from 0 to 1.5 volts, the voltages of the output voltage signals OUTP and OUTPB range from 6 to 12 volts, the first middle voltage VCL1 is 7.5 volts, and the second middle voltage VCL2 is 4.5 volts, but not limited to this.

The first transistor M1, the second transistor M2, the third transistor M3, and the fourth transistor M4 have a threshold voltage VTN larger than 0 and a breakdown voltage of 6 volts. The fifth transistor M5, the sixth transistor M6, the seventh transistor M7, and the eighth transistor M8 have a threshold voltage VTP larger than 0 and a breakdown voltage of 6 volts. The first transistor M1 the second transistor M2, the third transistor M3, and the fourth transistor M4 are operated under a voltage ranging from 0 to (4.5−VTN) volts and have a cross-voltage less than 6 volts. The fifth transistor M5, the sixth transistor M6, the seventh transistor M7, and the eighth transistor M8 are operated under a voltage ranging from (4.5+VTP) to 7.5 volts and have a cross-voltage less than 6 volts. The ninth transistor M9, the tenth transistor M10, the eleventh transistor M11, and the twelfth transistor M12 are operated under a voltage ranging from 6 to 7.5 volts and have a cross-voltage less than 6 volts.

Above all, it can be found that only eighteen transistors (the first transistor M1~the eighteenth transistor M18) in the two stages of level shifting unit (the first stage of level shifting unit 71 and the second stages of level shifting unit 72) are necessary for the level shifter 7 of the invention to finish the entire signal voltage level conversion process. It is much less transistors and stages of level shifting unit used in the level shifter 7 of the invention than the twenty-six transistors and the five stages of level shifting unit 11~15 in the conventional level shifter 1 shown in FIG. 1. No additional voltage source is necessary for the level shifter of the invention to provide middle voltages, the cost of the level shifter can be reduced and the efficiency of the level shifter 7 performing signal voltage level conversions in multi-power domain can be enhanced.

Another preferred embodiment of the invention is a level shifter operating method. In this embodiment, the level shifter operating method is used for operating a level shifter in a driving circuit of a display to convert an input voltage signal with low voltage level into an output voltage signal with high voltage level. The level shifter includes a first stage of level shifting unit and a second stage of level shifting unit.

The first stage of level shifting unit includes a first transistor, a second transistor, a third transistor, a fourth transistor, a fifth transistor, a sixth transistor, a seventh transistor, an eighth transistor, a ninth transistor, a tenth transistor, an eleventh transistor, and a twelfth transistor. The first transistor, the second transistor, the third transistor, the fourth transistor, the ninth transistor, and the tenth transistor are N-type MOSFETs; the fifth transistor, the sixth transistor, the seventh transistor, the eighth transistor, the eleventh transistor, and the twelfth transistor are P-type MOSFETs.

The first transistor, the third transistor, the fifth transistor, and the seventh transistor are coupled in series between a ground terminal and a first middle voltage. The second transistor, the fourth transistor, the sixth transistor, and the eighth transistor are coupled in series between the ground terminal and the first middle voltage. Gates of the first transistor and the second transistor being coupled to the input voltage signal. Gates of the third transistor, the fourth transistor, the fifth transistor, the sixth transistor are coupled to a second middle voltage which is smaller than the first middle voltage. Gates of the first transistor, the second transistor, the third transistor, and the fourth transistor are coupled to the ground terminal. Gates of the fifth transistor, the sixth transistor, the seventh transistor, and the eighth transistor are coupled to the first middle voltage. A gate of the seventh transistor is coupled to a first node between the sixth transistor and the eighth transistor. A gate of the eighth transistor is coupled to a second node between the fifth transistor and the seventh transistor.

Gates of the ninth transistor and the tenth transistor are coupled to the second node between the fifth transistor and the seventh transistor. Gates of the eleventh transistor and the twelfth transistor are coupled to the first node between the sixth transistor and the eighth transistor. The gates of the ninth transistor and the tenth transistor are coupled to the half operational voltage respectively. The gates of the eleventh transistor and the twelfth transistor are coupled to the first middle voltage respectively.

The second stage of level shifting unit includes a thirteenth transistor, a fourteenth transistor, a fifteenth transistor, a sixteenth transistor, a seventeenth transistor, and an eighteenth transistor. The thirteenth transistor and the fourteenth transistor are N-type MOSFETs; the fifteenth transistor, the sixteenth transistor, the seventeenth transistor, and the eighteenth transistor are P-type MOSFETs. The thirteenth transistor, the fifteenth transistor, and the seventeenth transistor are coupled in series between the half operational voltage and an operational voltage, and the half operational voltage is half of the operational voltage. The fourteenth transistor, the sixteenth transistor, and the eighteenth transistor are coupled in series between the half operational voltage and the operational voltage. Gates of the thirteenth transistor and the fourteenth transistor are coupled to the half operational voltage. Gates of the fifteenth transistor, the sixteenth transistor, the seventeenth transistor, the eighteenth transistor are coupled to the operational voltage. Gates of the thirteenth transistor and the fifteenth transistor are coupled to a third node between the ninth transistor and the eleventh transistor. Gates of the fourteenth transistor and the sixteenth transistor are coupled to a fourth node between the tenth transistor and the twelfth transistor. The seventeenth transistor is coupled to a fifth node between the fourteenth transistor and the sixteenth transistor via a first output terminal. The eighteenth transistor is coupled to a sixth node between the thirteenth transistor and the fifteenth transistor via a second output terminal.

Figure 9:
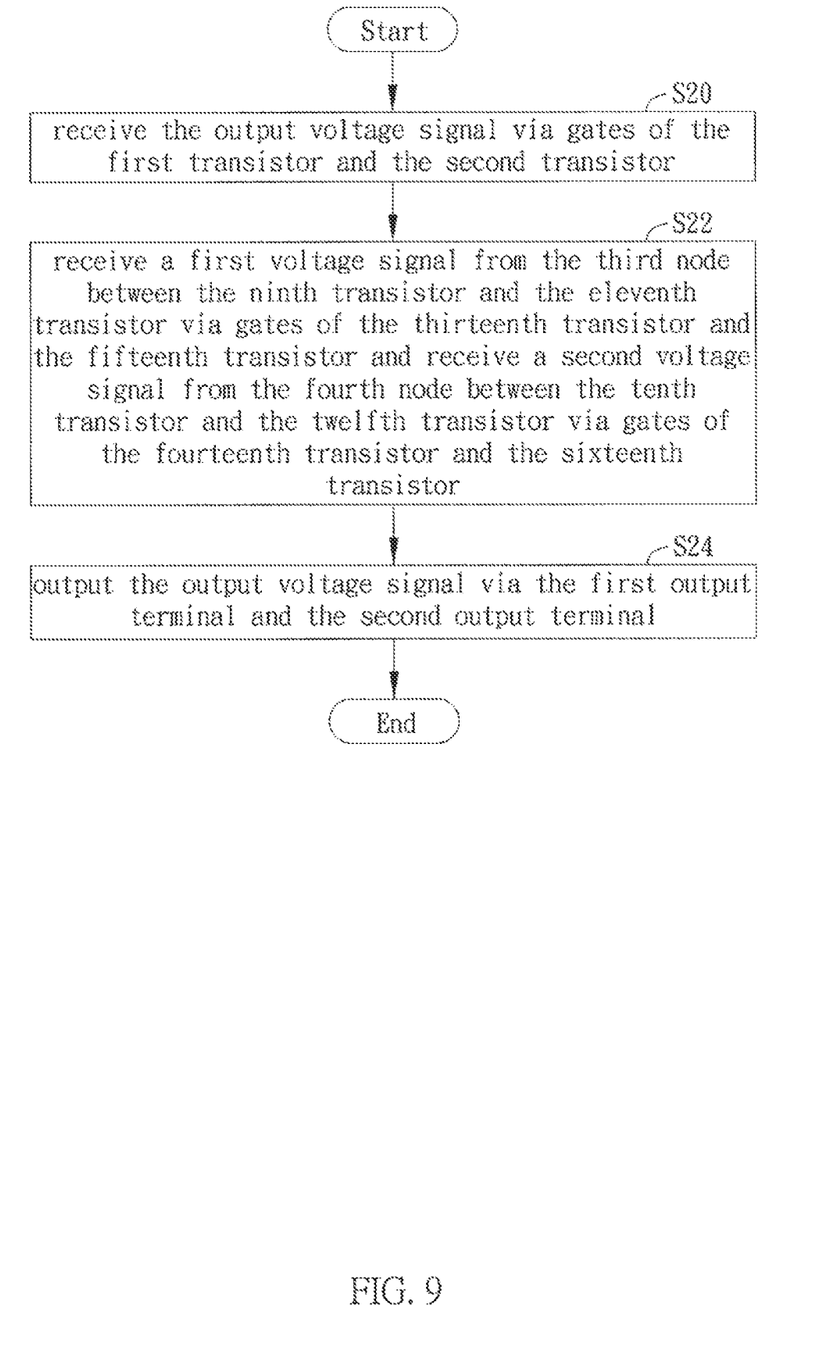
FIG. 9 illustrates a flow chart of the level shifter operating method in another preferred embodiment of the invention.

Please refer to FIG. 9. FIG. 9 illustrates a flow chart of the level shifter operating method in this embodiment. As shown in FIG. 9, at first, in the step S20, the method receives the output voltage signal via gates of the first transistor and the second transistor. Then, in the step S22, the method receives a first voltage signal from the third node between the ninth transistor and the eleventh transistor via gates of the thirteenth transistor and the fifteenth transistor and receives a second voltage signal from the fourth node between the tenth transistor and the twelfth transistor via gates of the fourteenth transistor and the sixteenth transistor. Then, in the step S24, the method outputs the output voltage signal via the first output terminal and the second output terminal.

Compared to the prior arts, the level shifter of the driving circuit and the level shifter operating method in the invention have following advantages.

(1) Since fewer MOSFETs are necessary for the level shifter of the invention than the conventional level shifter and no additional voltage source is necessary for the level shifter of the invention to provide middle voltages, the cost of the level shifter can be reduced and the circuit structure of the level shifter can be simplified.

(2) Since only two stages of level shifting unit are necessary for the level shifter of the invention to finish the entire signal voltage level conversion process, it is time-saving and the efficiency of the level shifter performing signal voltage level conversions in multi-power domain can be enhanced.

(3) The area of the circuit layout in the level shifter of the invention can be reduced by suitable coupling and design of the MOSFETs in the first stage of level shifting unit.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

The invention claimed is:

1. A level shifter, applied in a driving circuit of a display, for converting an input voltage signal with low voltage level into an output voltage signal with high voltage level, the level shifter comprising:

a first stage of level shifting unit comprising a first transistor, a second transistor, a third transistor, a fourth transistor, a fifth transistor, a sixth transistor, a seventh transistor, and an eighth transistor, wherein the first transistor, the second transistor, the third transistor, and the fourth transistor are N-type MOSFETs; the fifth transistor, the sixth transistor, the seventh transistor, and the eighth transistor are P-type MOSFETs; the first transistor, the third transistor, the fifth transistor, and the seventh transistor are coupled in series between a ground terminal and an operational voltage; the second transistor, the fourth transistor, the sixth transistor, and the eighth transistor are coupled in series between the ground terminal and the operational voltage; gates of the first transistor and the second transistor are coupled to the input voltage signal; gates of the third transistor, the fourth transistor, the fifth transistor, the sixth transistor are coupled to a half operational voltage which is half of the operational voltage; a gate of the seventh transistor is coupled to a first node between the sixth transistor and the eighth transistor; a gate of the eighth transistor is coupled to a second node between the fifth transistor and the seventh transistor;

a second stage of level shifting unit comprising a ninth transistor, a tenth transistor, an eleventh transistor, and a twelfth transistor, wherein the second stage of level shifting unit is coupled to the first stage of level shifting unit; the ninth transistor and the tenth transistor are N-type MOSFETs; the eleventh transistor and the twelfth transistor are P-type MOSFETs; the ninth transistor and the eleventh transistor are coupled in series between the half operational voltage and the operational voltage; the tenth transistor and the twelfth transistor are coupled in series between the half operational voltage and the operational voltage; a gate of the ninth transistor is coupled to a first output terminal between the tenth transistor and the twelfth transistor; a gate of the tenth transistor is coupled to a second output terminal between the ninth transistor and the eleventh transistor; a gate of the eleventh transistor is coupled to the first node; a gate of the twelfth transistor is coupled to the second node; the second stage of level shifting unit outputs the output voltage signal via the first output terminal and the second output terminal; and another second stage of level shifting unit comprising a thirteenth transistor, a fourteenth transistor, a fifteenth transistor, and a sixteenth transistor, wherein the another second stage of level shifting unit is coupled to the first stage of level shifting unit; the thirteenth transistor and the fourteenth transistor are N-type MOSFETs; the fifteenth transistor and the sixteenth transistor are P-type MOSFETs; the thirteenth transistor and the fifteenth transistor are coupled in series between the ground terminal and the half operational voltage; the fourteenth transistor and the sixteenth transistor are coupled in series between the ground terminal and the half operational voltage; a gate of the thirteenth transistor is coupled between the first transistor and the third transistor; a gate of the fourteenth transistor is coupled between the second transistor and the fourth transistor; a gate of the fifteenth transistor is coupled to a third output terminal between the fourteenth transistor and the sixteenth transistor; a gate of the sixteenth transistor is coupled to a fourth output terminal between the thirteenth transistor and the fifteenth transistor; a gate of the twelfth transistor is coupled to the second node; the another second stage of level shifting unit outputs another output voltage signal via the third output terminal and the fourth output terminal.

2. The level shifter of claim 1, wherein the operational voltage is 12 volts, the half operational voltage is 6 volts, the voltage of the input voltage signal ranges from 0 to 1.5 volts, and the voltage of the output voltage signal ranges from 6 to 12 volts.

3. The level shifter of claim 2, wherein the first transistor, the second transistor, the third transistor, and the fourth transistor have a threshold voltage VTN and a breakdown voltage of 6 volts, the fifth transistor, the sixth transistor, the seventh transistor, and the eighth transistor have a threshold voltage VTP and a breakdown voltage of 6 volts, the first transistor and the second transistor are operated under a voltage ranging from 0 to (6-VTN) volts and have a cross-voltage less than 6 volts; the third transistor and the fourth transistor are operated under a voltage ranging from VTN to 6 volts and have a cross-voltage less than 6 volts; the fifth transistor and the sixth transistor are operated under a voltage ranging from 6 to (12−VTP) volts and have a cross-voltage less than 6 volts; the seventh transistor and the eighth transistor are operated under a voltage ranging from (6+VTP) to 12 volts and have a cross-voltage less than 6 volts, VTN and VTP are both larger than 0.

4. The level shifter of claim 1, wherein the another output voltage signal and the output voltage signal have the same logic and different voltage ranges.

5. The level shifter of claim 1, wherein the operational voltage is 12 volts, the half operational voltage is 6 volts, the voltage of the input voltage signal ranges from 0 to 1.5 volts, the voltage of the output voltage signal ranges from 6 to 12 volts, and the voltage of the another output voltage signal ranges from 0 to 6 volts.

6. A level shifter operating method, for operating a level shifter in a driving circuit of a display to convert an input voltage signal with low voltage level into an output voltage signal with high voltage level, the level shifter comprising a first stage of level shifting unit and a second stage of level shifting unit, the second stage of level shifting unit being coupled to the first stage of level shifting unit, the first stage of level shifting unit comprising a first transistor, a second transistor, a third transistor, a fourth transistor, a fifth transistor, a sixth transistor, a seventh transistor, and an eighth transistor; the second stage of level shifting unit comprising a ninth transistor, a tenth transistor, an eleventh transistor, and a twelfth transistor; the first transistor, the second transistor, the third transistor, the fourth transistor, the ninth transistor, and the tenth transistor being N-type MOSFETs; the fifth transistor, the sixth transistor, the seventh transistor, the eighth transistor, the eleventh transistor, and the twelfth transistor being P-type MOSFETs; the first transistor, the third transistor, the fifth transistor, and the seventh transistor being coupled in series between a ground terminal and an operational voltage; the second transistor, the fourth transistor, the sixth transistor, and the eighth transistor being coupled in series between the ground terminal and the operational voltage; gates of the third transistor, the fourth transistor, the fifth transistor, the sixth transistor being coupled to a half operational voltage which is half of the operational voltage; a gate of the seventh transistor being coupled to a first node between the sixth transistor and the eighth transistor; a gate of the eighth transistor being coupled to a second node between the fifth transistor and the seventh transistor; the ninth transistor and the eleventh transistor being coupled in series between the half operational voltage and the operational voltage; the tenth transistor and the twelfth transistor being coupled in series between the half operational voltage and the operational voltage; a gate of the ninth transistor being coupled to a first output terminal between the tenth transistor and the twelfth transistor; a gate of the tenth transistor is coupled to a second output terminal between the ninth transistor and the eleventh transistor; a gate of the eleventh transistor being coupled to the first node; a gate of the twelfth transistor being coupled to the second node; the level shifter further comprising another second stage of level shifting unit, and the another second stage of level shifting unit being coupled to the first stage of level shifting unit; the another second stage of level shifting unit comprising a thirteenth transistor, a fourteenth transistor, a fifteenth transistor, and a sixteenth transistor, a gate of the thirteenth transistor being coupled between the first transistor and the third transistor; a gate of the fourteenth transistor being coupled between the second transistor and the fourth transistor; a gate of the fifteenth transistor being coupled to a third output terminal between the fourteenth transistor and the sixteenth transistor; a gate of the sixteenth transistor being coupled to a fourth output terminal between the thirteenth transistor and the fifteenth transistor; the level shifter operating method comprising steps of:

(a) receiving the output voltage signal via gates of the first transistor and the second transistor;

(b) receiving a first voltage signal and a second voltage signal from the first node and the second node respectively via the eleventh transistor and the twelfth transistor;

(c) outputting the output voltage signal via the first output terminal and the second output terminal;

(d) receiving a third voltage signal between the first transistor and the third transistor via the gate of the thirteenth transistor and receiving a fourth voltage signal between the second transistor and the fourth transistor via the gate of the fourteenth transistor; and (e) outputting another output voltage signal via the third output terminal and the fourth output terminal.

7. The level shifter operating method of claim 6, wherein the operational voltage is 12 volts, the half operational voltage is 6 volts, the voltage of the input voltage signal ranges from 0 to 1.5 volts, and the voltage of the output voltage signal ranges from 6 to 12 volts.

8. The level shifter operating method of claim 7, wherein the first transistor, the second transistor, the third transistor, and the fourth transistor have a threshold voltage VTN and a breakdown voltage of 6 volts, the fifth transistor, the sixth transistor, the seventh transistor, and the eighth transistor have a threshold voltage VTP and a breakdown voltage of 6 volts, the first transistor and the second transistor are operated under a voltage ranging from 0 to (6−VTN) volts and have a cross-voltage less than 6 volts; the third transistor and the fourth transistor are operated under a voltage ranging from VTN to 6 volts and have a cross-voltage less than 6 volts; the fifth transistor and the sixth transistor are operated under a voltage ranging from 6 to (12−VTP) volts and have a cross-voltage less than 6 volts; the seventh transistor and the eighth transistor are operated under a voltage ranging from (6+VTP) to 12 volts and have a cross-voltage less than 6 volts, VTN and VTP are both larger than 0.

9. The level shifter operating method of claim 6, wherein the another output voltage signal and the output voltage signal have the same logic and different voltage ranges.

10. The level shifter operating method of claim 6, wherein the operational voltage is 12 volts, the half operational voltage is 6 volts, the voltage of the input voltage signal ranges from 0 to 1.5 volts, the voltage of the output voltage signal ranges from 6 to 12 volts, and the voltage of the another output voltage signal ranges from 0 to 6 volts.

* * * * *